United States Patent
Grunzke

(10) Patent No.: US 8,250,418 B2
(45) Date of Patent: *Aug. 21, 2012

(54) TEST MODE FOR PARALLEL LOAD OF ADDRESS DEPENDENT DATA TO ENABLE LOADING OF DESIRED DATA BACKGROUNDS

(75) Inventor: Terry Grunzke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/214,015

(22) Filed: Aug. 19, 2011

(65) Prior Publication Data

US 2011/0302470 A1 Dec. 8, 2011

Related U.S. Application Data

(63) Continuation of application No. 12/098,912, filed on Apr. 7, 2008, now Pat. No. 8,015,460.

(51) Int. Cl.
*G11C 29/00* (2006.01)
*G01R 31/28* (2006.01)
*G06F 9/34* (2006.01)

(52) U.S. Cl. . 714/719; 714/718; 714/742; 714/E11.177; 711/217; 365/201

(58) Field of Classification Search ............. 714/719, 714/718, 742, E11.177; 711/217; 365/201
See application file for complete search history.

(56) References Cited

U.S. PATENT DOCUMENTS

| | | | |
|---|---|---|---|
| 5,184,320 A | 2/1993 | Dye | 365/49.15 |
| 5,418,907 A | 5/1995 | Ohki | 365/230.05 |
| 5,490,115 A | 2/1996 | Shah et al. | 365/201 |
| 5,773,993 A | 6/1998 | Trimberger | 326/38 |
| 5,812,147 A | 9/1998 | Van Hook et al. | 345/537 |
| 5,991,213 A | 11/1999 | Cline et al. | 365/201 |
| 5,996,106 A | 11/1999 | Seyyedy | 714/763 |
| 5,999,478 A | 12/1999 | Proebsting | 365/230.05 |
| 6,182,262 B1 | 1/2001 | Seyyedy | 714/763 |
| 6,288,958 B1 | 9/2001 | Suzuki | 365/201 |
| 6,396,303 B1 | 5/2002 | Young | 326/39 |
| 6,512,683 B2 | 1/2003 | Hsu et al. | 365/49.1 |
| 6,560,740 B1 | 5/2003 | Zuraski et al. | 714/733 |
| 6,684,356 B2 | 1/2004 | Raad et al. | 714/719 |
| 7,209,388 B2 | 4/2007 | Kanda | 365/185.09 |
| 2010/0174955 A1 | 7/2010 | Carnevale et al. | 714/718 |

*Primary Examiner* — John J Tabone, Jr.
(74) *Attorney, Agent, or Firm* — Dorsey & Whitney LLP

(57) ABSTRACT

One or more embodiments of the invention enable a memory device to load its memory array with desired background data, such as to reduce total test time and costs associated with testing. A background data loading circuit according to one embodiment of the invention includes a buffer, a data loading circuit, and a pattern generating logic. The buffer is coupled to the array of memory cells. The data loading circuit is coupled to load data into the buffer to be transferred to a respective row of the memory cells. The pattern generating logic is coupled to the data loading circuit. The pattern generating logic applies a pattern generating algorithm corresponding to a test mode when the memory devices is in the test mode and generates patterns of data each for a respective row of the memory cells according to the pattern generating algorithm. The pattern generating logic further causes the data loading circuit to load each of the generated patterns of data into the buffer for transferring to a respective row of the memory cells.

19 Claims, 8 Drawing Sheets

TEST MODE FOR PARALLEL LOAD OF ADDRESS DEPENDENT DATA TO ENABLE LOADING OF DESIRED DATA BACKGROUNDS

CROSS-REFERENCE TO RELATED APPLICATION

This application is a continuation of U.S. patent application Ser. No. 12/098,912, filed Apr. 7, 2008, U.S. Pat. No. 8,015,460. This application is incorporated by reference herein in its entirety and for all purposes.

TECHNICAL FIELD

Embodiments of the invention relate to memory devices and, more particularly, to loading a desired pattern of data into memory of a memory device for testing of the memory.

BACKGROUND OF THE INVENTION

Non-volatile memory is widely used nowadays in computers and electronic devices that have data storage capability. Because non-volatile memory can retain the stored information even when not powered, it is typically used for the task of secondary storage, or long-term persistent storage. There are several types of non-volatile memory. An electrically erasable programmable read-only memory (EEPROM) is a type of non-volatile memory that can be erased and programmed by exposing it to an electrical charge. Another type of non-volatile memory is a flash memory.

Flash memory devices have developed into a popular source of non-volatile memory for a wide range of electronic applications. Flash memory devices typically use a one-transistor memory cell structure that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware for a computer system can typically be stored in flash memory devices as well.

There are two common types of flash memory array architectures—the "NAND" and "NOR" architectures. NAND flash memory devices are typically used as mass data storage devices, and NOR flash memory devices are typically used as information storage devices for processing data at a high speed. Although each type of flash architecture has its advantages and disadvantages, NAND flash memory devices are widely in use especially in applications such as removable universal serial bus (USB) interface storage devices. This is partly because NAND flash architecture requires less chip area to implement a given capacity of flash memory compared with NOR flash architecture.

As part of the manufacturing process, the memory arrays of memory devices are tested to find and repair flawed sections of the array with redundant memory array sections, such as redundant rows and columns, that are available for such purpose. In some of the tests, data test patterns that are designed to locate specific array flaws (e.g. shorted or open bit lines and columns, stuck at "0" or "1" memory cells, etc.) are written, or programmed, to the memory array. Once the selected test pattern has been programmed into the array, it is read back and compared against the expected, e.g., original, pattern that is still resident in, or has been loaded into, an input/output (I/O) buffer of the memory device.

For example, for read self error detect (SED) testing of a NAND flash memory device, the data stored in each page, e.g., row, of memory cells of the memory array is read to a first I/O buffer, e.g., a data register, of the memory device and compared to the expected data that is loaded into a second I/O buffer, e.g., a cache register, of the flash memory device. More specifically, for read SED testing of the flash memory devices on a burn-in-board (BIB), a parallel read page command is given to all the memory devices on the BIB. After each read of each page is complete, the tester serially loads each device's cache register with the expected data, which is to be compared with the data read from the respective page.

Although the loading of the expected data into the cache register of a memory device undergoing the read SED test is in parallel with the loading of the data into the other memory devices that are also undergoing the test, the loading of the expected data into a cache register is done in a serial fashion—one byte at a time. Typically, the internal read time for data to be read from a page of the memory array to the data register is about 50 uS (microsecond). In contrast, for a 4K-byte cache register (corresponding to a 4K-byte-per-page memory array), the time for the expected data to be serially loaded into the cache register is typically equal to the write cycle time (30 nS) multiplied by the number of bytes in the cache register (4,314 bytes), or about 129 uS. As can be seen, the time for serially loading data into the cache register is a large portion of the total test time for a read SED test. In addition to the relatively large amount of time required to load the expected data, the use of I/O equipment is necessary to provide the desired background data into the memory devices. As such, resources such as I/O equipment and time for personnel to set up the equipment are unavoidable in order to run a read SED test. The large total test time and resource overhead are undesirable especially in view of time to market and costs.

Accordingly, there is a need and desire for a technique to enable a memory device having non-volatile memory, as well as a memory device having volatile memory, to load its memory array with desired background data to reduce total test time and costs associated with testing.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
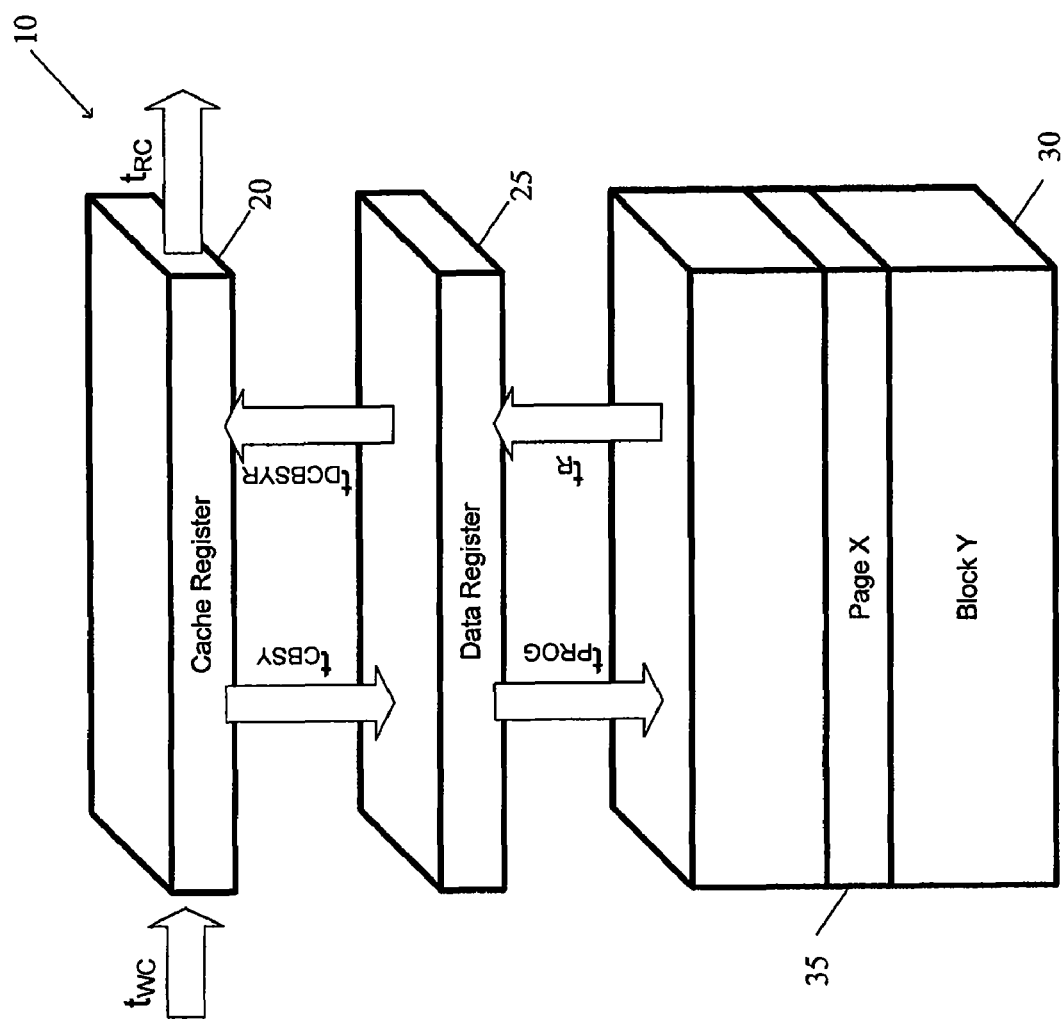
FIG. 1 is a block diagram showing a cache mode architecture of a conventional flash memory device.

FIG. 1 is a block diagram showing a cache mode architecture 10 of a conventional NAND flash memory array. A conventional flash memory device typically has an I/O buffer coupled to the memory array of the memory device. As shown in FIG. 1, an I/O buffer in the form of two registers, a data register 25 and a cache register 20, are coupled to a block Y 30 of the memory device's memory array. The data register 25 is coupled to the block Y 30 of the flash memory array, and the cache register 20 is indirectly coupled to block Y 30 through the data register 25. Typically, during standard page operations the data register 25 and cache register 20 operate together as a single register, and during cache operations the data register 25 and cache register 20 operate independently.

In general, a NAND flash memory array like the one shown in FIG. 1 is programmed and read in page-based operations, and is erased in block-based operations. Hence, typically each of the cache register 20 and the data register 25 has the same size as each page of memory cells, such as page X 35 of block Y 30. In other words, each of the cache register 20 and the data register 25 is capable of storing the same number of data digits (e.g., bits) as the number of data digits that can be stored in a page of memory cells.

During a cache programming operation, data is serially clocked into the cache register. This portion of the cache programming operation is primarily controlled by timing parameter tWC. After the cache register 20 is loaded, data is transferred from the cache register 20 to the data register 25, freeing the cache register 20 for the next programming operation. This portion of the cache programming operation is primarily controlled by timing parameter tCBSY. After the data is transferred into the data register 25, the contents of the data register 25 are programmed to the addressed page, page X 35 in this example, of the NAND flash memory array. This portion of the cache programming operation is primarily controlled by timing parameter tPROG.

During a cache read operation, data is transferred from the addressed page X 35 of the NAND flash memory array into the data register 25. This portion of the cache read operation is primarily controlled by timing parameter tR. After the page of data is transferred into the data register 25, the data is transferred from the data register 25 to the cache register 20. This portion of the cache read operation is primarily controlled by timing parameter tDCBSYR. After the data is loaded into the cache register 20, it is serially clocked out by toggling RE#. This portion of the cache read operation is primarily controlled by timing parameter tRC.

Figure 2:
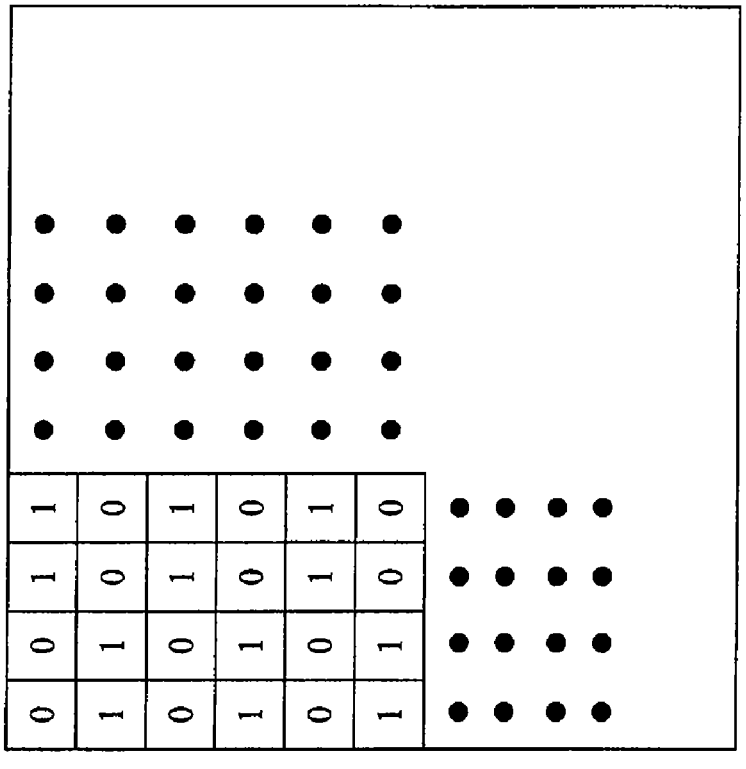
FIG. 2 is an example of a partial data pattern to be loaded into the cache register of a flash memory device for read self error detect testing.

FIG. 2 is an example of a partial data pattern 200 to be loaded into the cache register of a flash memory device for read self error detect (SED) testing. In the example shown in FIG. 2, the pattern, which is also referred to herein as background data, includes data digits having a binary value "0" and data digits having a binary value "1". The pattern of the data digits may differ from page to page, and may be the same between any two pages. For example, as shown in FIG. 2, the pattern of the data digits for page 0 may be the same as that for page 1, at least for the several columns shown. Likewise, the pattern of the data digits for page 2 may be the same as that for page 3, at least for those columns shown. Alternatively, each of the pages may have a pattern of data digits different from any other page. Whatever the case may be, it will be understood that FIG. 2 is provided only as an example of background data that may be used in performing read SED testing on the memory array of a flash memory device. Background data with a pattern different from that shown in FIG. 2 may be used with various embodiments of the invention.

As explained previously, during read SED testing, data is read from the memory array, one page at a time, to be compared with the correct, expected data. In a conventional flash memory device, when data is to be loaded into the cache register for read SED testing, the column decoder enables a CSL_WR signal for eight digits of the cache register at a time, so that the data can be loaded into the cache register one byte at a time from I/O lines, which receive the write data from a source outside the memory device. In reference to FIG. 1, one page of a data pattern, such as the data pattern 200, previously stored in the memory array is transferred from the memory array to the data register 25. The expected data for the respective page is then serially loaded into the cache register 20 one byte at a time. If page after page the data transferred to the data register 25 from the memory array match the expected data loaded into the cache register 20, then the respective memory device passes the read SED test. Otherwise, the memory device fails the test. A signal indicating whether the memory device has passed the read SED test or a similar test may be generated by the memory device and received by the tester.

Figure 3:
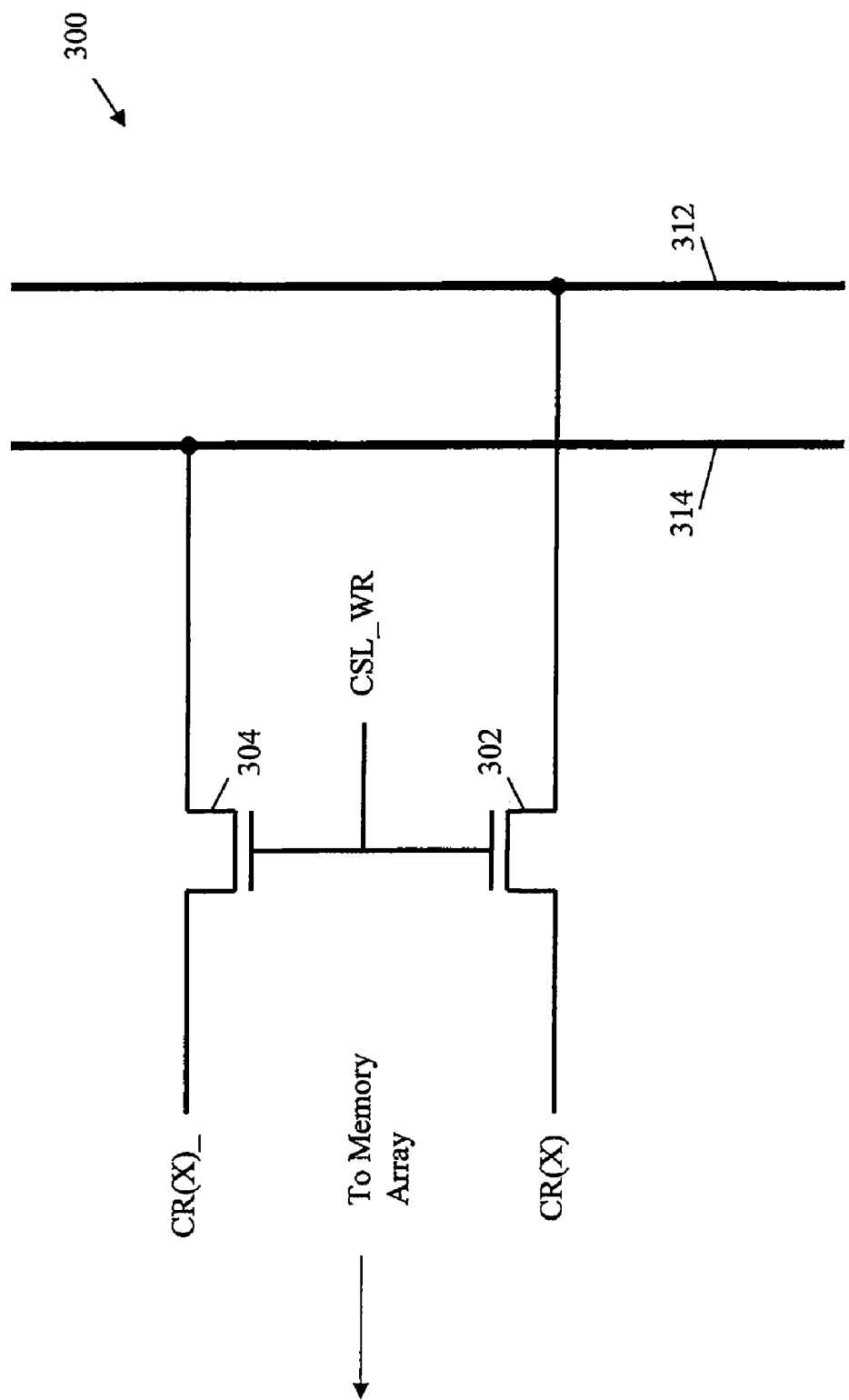
FIG. 3 is a schematic diagram showing the manner in which each digit of a cache register may be coupled for data loading according to an embodiment of the invention.

FIG. 3 is a schematic diagram 300 showing the manner in which each digit of a cache register may be coupled for data loading according to an embodiment of the invention. In one embodiment of the invention, each digit of the cache register, CR(X), is coupled to a I/O line 312 through a switch 302, such as an n-channel metal-oxide-semiconductor field effect transistor (MOSFET). Each complementary digit of the cache register, CR(X)_, is coupled to a complementary I/O line 314 through a switch 304, such as an n-channel MOSFET.

When the CSL_WR signal goes high, switches 302 and 304 are activated, which can also be referred to as enabled, to couple the cache register digit CR(X) and complementary digit CR(X)_ to the I/O lines 312 and 314, respectively. The I/O line 312 and complementary I/O line 314 are each set to a respective voltage different from the other such that CR(X) and CR(X)_ are each loaded with a data digit having a respective value different than the other. For example, the I/O line 312 may be set to a relatively higher voltage in order to load CR(X) with the data digit "1" while the complementary I/O line 314 may be set to a relatively lower voltage in order to load CR(X)_ with the data digit "0" when CSL_WR goes high. The I/O line 312 and the complementary I/O line 314 may each be an I/O line as an existing part of the I/O bus 134 in FIG. 7 in one embodiment of the invention. Alternatively, in another embodiment of the invention, the I/O line 312 and the complementary I/O line 314 may each be a voltage line that is not part of the memory device's I/O circuitry.

In one embodiment of the invention, each page of data digits of background data can be loaded into a cache register in a two-pass operation using a pattern generating equation, which can also be referred to as a pattern generating algorithm. In the first pass, the digits of the cache register corresponding to those digits on a page to be set to "0" are simultaneously loaded with the digit "0". This can be achieved by, for example, setting the voltage on the I/O line 312 to a relatively lower voltage corresponding to a binary value of "0" and providing a high CSL_WR signal for only those digits of the cache registers corresponding to those digits on the page to be set to "0". In the second pass, the digits of the cache register corresponding to those digits on a page to be set to "1" are simultaneously loaded with the digit "1". This can be achieved by, for example, setting the voltage on the I/O line 312 to a relatively higher voltage corresponding to a binary value of "1" and providing a high CSL_WR signal for only those digits of the cache registers corresponding to those digits on the page to be set to "1". In each pass, the pattern generating algorithm identifies and selects those digits of the cache register to be coupled to the I/O line 312 for loading of a data digit having a respective value, whether 0 or 1, to load the desired background data for the respective page. As a result, background data is loaded into each page in a parallel fashion in at most two passes, rather than being loaded in serial fashion only one byte at a time. Consequently, reduction of total test time and the associated costs can be achieved using such technique.

Figure 4:
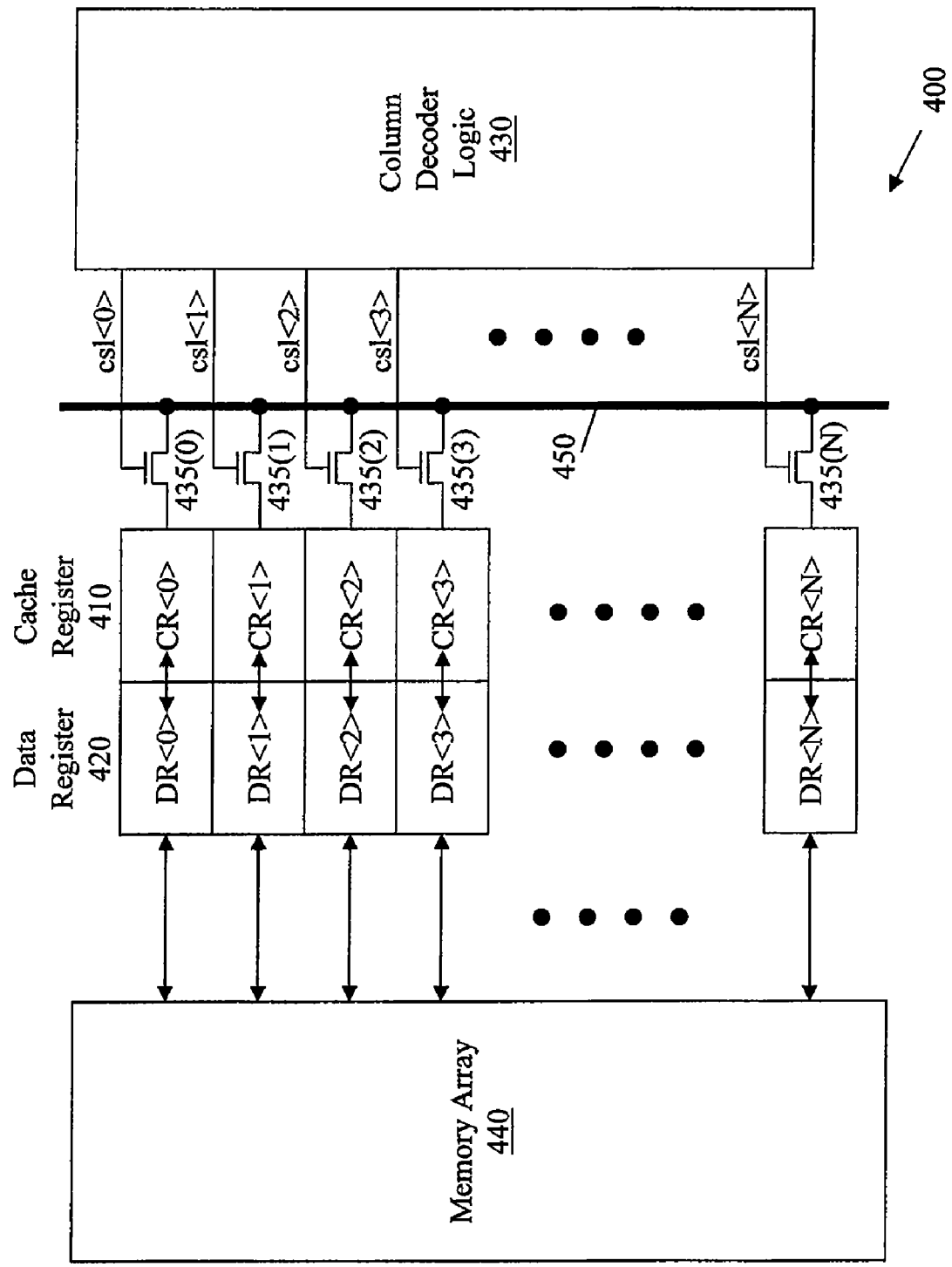
FIG. 4 is a schematic diagram showing the manner in which the cache register may be coupled for data loading according to another embodiment of the invention.

FIG. 4 is a schematic diagram 400 showing the manner in which the cache register may be coupled for data loading according to another embodiment of the invention. As shown in FIG. 4, column decoder logic 430 is coupled to a plurality of switches 435(0)-435(N), which will couple the digits CR(0)-CR(N) of a cache register 410 to an I/O line 450 when enabled. Each of the digits CR(0)-CR(N) of the cache register 410 is coupled to a respective one of the digits DR(0)-DR(N) of a data register 420, which is coupled to a flash memory array 440. Typically, in a conventional flash memory device, the column decoder logic 430 sets the respective CSL signal high for eight digits at a time because only eight digits are selected simultaneously to load a byte of data per input/output cycle.

In contrast, in one embodiment of the invention, as many as all of the switches 435(0)-435(N) may be enabled simultaneously in accordance with a data pattern generating algorithm to load a digit of data into the respective digits CR(0)-CR(N) of the cache register 410. As such, whatever data value, as represented by the I/O line voltage value, is on the I/O line 450 at the time select ones of the digits CR(0)-CR(N) of the cache register 410 are coupled to the I/O line 450 is loaded into the digits CR(0)-CR(N) of the cache register 410. More specifically, the algorithm sets select ones of the csl(0)-csl(N) signals high so that the respective select ones of the digits CR(0)-CR(N) of the cache register 410 are simultaneously loaded with a digit of data having a value corresponding to the voltage value on the I/O line 450 at the time. Thus, for example, with the I/O line 450 at a relatively higher voltage, the algorithm may cause the column decoder logic 430 to set some of the csl(0)-csl(N) signals high in order to simultaneously load respective select ones of the digits CR(0)-CR(N) of the cache register 410 with a data digit having a binary value of "1" in a first pass. Then, in the next pass, with the I/O line 450 at a relatively lower voltage, the algorithm may cause the column decoder logic 430 to set the remaining ones of the csl(0)-csl(N) signals high in order to simultaneously load the remaining ones of the digits CR(0)-CR(N) of the cache register 410 with a data digit having a binary value of "0".

Figure 7:
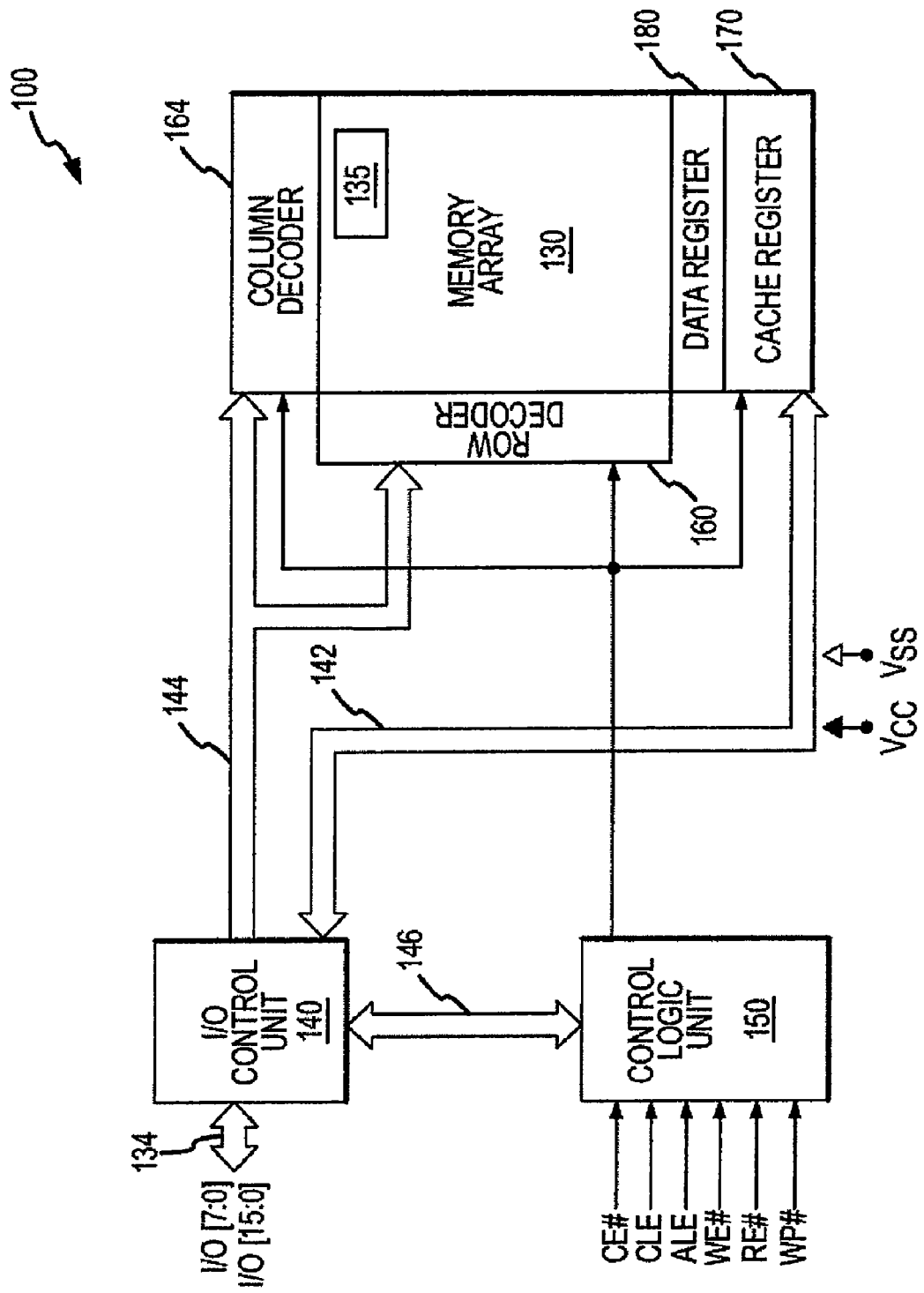
FIG. 7 is a simplified block diagram of a flash memory device in accordance with an embodiment of the invention.

The pattern generating algorithm may be implemented in a control logic, such as the control logic unit 150 in FIG. 7, in one embodiment. Alternatively, the pattern generating algorithm may be implemented in the column decoder logic 430 or another location within the memory device. In any case, the pattern generating algorithm allows a parallel load of the digits on each page according to a pre-determined data pattern. Additionally, when determining the data pattern to be loaded, the algorithm takes into account the page and/or block address so that the appropriate data pattern for each page and/or block is loaded accordingly.

Figure 5:
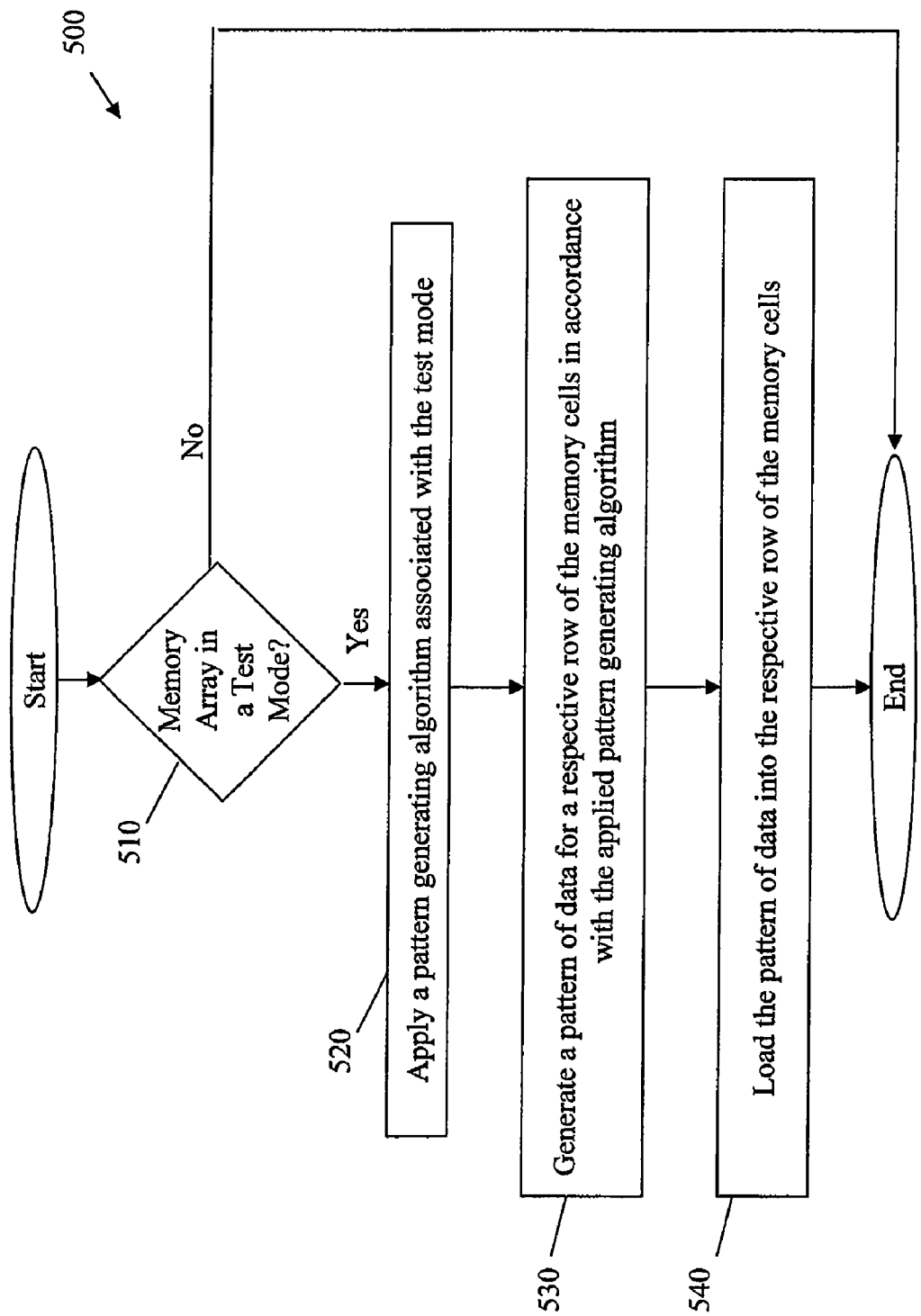
FIG. 5 is a flow chart showing a process of loading desired background data into a row of memory cells of a memory device in accordance with an embodiment of the invention.

FIG. 5 is a flow chart showing a process 500 of loading desired background data into a row of memory cells of a memory device in accordance with an embodiment of the invention. The process 500 may be utilized to load desired background data into one, some, or all of the rows, or pages, of memory cells of a memory array, such as a NAND flash memory array, in a memory device. The process begins by determining whether the memory array is in a test mode in step 510. If the memory array is not in a test mode the process 500 ends. If, however, it is determined that the memory array is in a test mode the process 500 will proceed to the next step. In step 520, a pattern generating algorithm associated with the test mode is applied. Next, in step 530, a pattern of data is generated for a respective row of the memory cells in accordance with the applied pattern generating algorithm. In step 540, the pattern of data is loaded into the respective row of the memory cells.

Steps 530-540 may be repeated to load data pattern into more rows of the memory array if the process 500 is utilized to load data patterns into more than one rows of memory cells. In such case, in an alternative embodiment of the invention, the process 500 may be modified to include an additional step (not shown in FIG. 5) to verify whether or not there is any row remaining for a respective data pattern to be loaded into. If there is at least one row remaining for data pattern to be loaded into, the modified process 500 will repeat steps 530 and 540 for each of the remaining rows. If there is no more row remaining, the modified process 500 will end.

As can be seen, the process 500 allows memory devices to be programmed with desired background data without having to enter the background data through automatic test equipment (ATE) and massively parallel test (MPT) ovens. Compared with the conventional way of loading desired background data into the memory arrays of memory devices, the process 500 should not only reduce total test time but also save tester resources.

Figure 6:
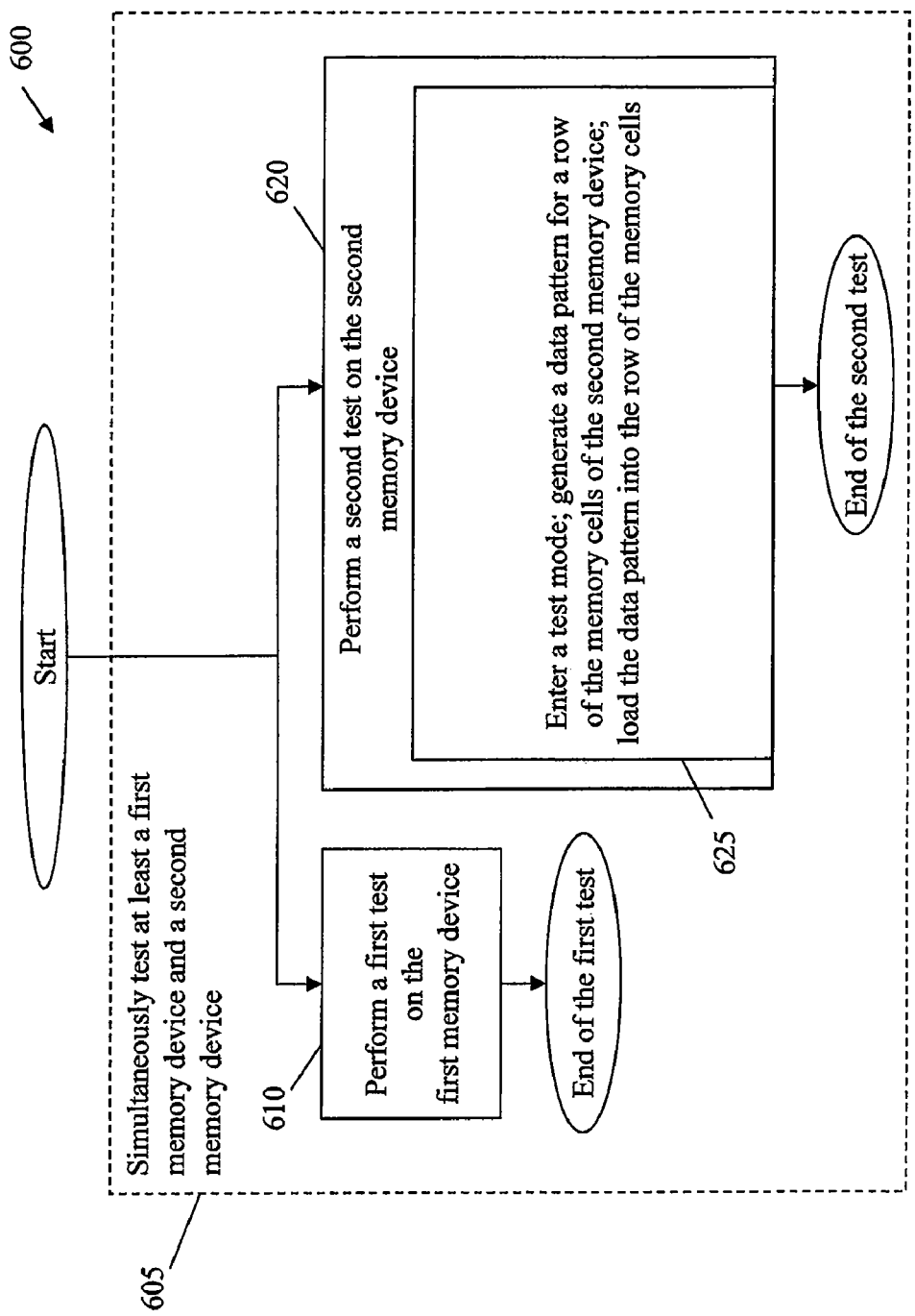
FIG. 6 is a flow chart showing a process of testing a plurality of memory devices in accordance with an embodiment of the invention.

FIG. 6 is a flow chart showing a process 600 of testing a plurality of memory devices in accordance with an embodiment of the invention. The process 600 may be utilized to test multiple memory devices simultaneously. For example, process 600 may be implemented to test a number of memory devices that are mounted on a testing platform, such as a burn-in board. In step 605, at least two of the memory devices on the burn-in board are simultaneously tested. More specifically, in step 610, one of the memory devices undergoes a first test. In step 620, which occurs concurrently with step 610, another one of the memory devices undergoes a second test that may be different than the first test. As part of the second test, data digits of desired background data are loaded into the memory array of the memory device that is undergoing the second test. More particularly, in step 625, the second memory device enters a test mode and generates a data pattern for a row of the memory cells of a memory array in the second memory device. Then, the data pattern is loaded into the row of the memory cells.

Using the process 600, different tests, including a test that requires loading background data into the memory array of a memory device, can be carried out concurrently on two or more memory devices that are on the same platform. For example, a test that requires I/O equipment may be conducted on one or more memory devices to perform datasheet operations while another test that requires no tester resource, such as the second test described in steps 620, 625, may be conducted on one or more of the other memory devices. Thus, the process 600 helps improve tester efficiency while still allowing testing of all operations on the particular platform.

FIG. 7 is a simplified block diagram of a NAND flash memory device 100 in accordance with an embodiment of the invention. The NAND flash memory device 100 includes an array 130 of flash memory cells logically arranged in banks of rows and columns. It should be noted that the terms "row", "rows", "column" and "columns" referred to herein are not intended to require any particular physical orientation or linearity. Typically, in a conventional NAND flash memory device, data, commands, and addresses are multiplexed onto the same pins and received by a I/O control unit 140 as sets of sequential I/O signals transmitted through an I/O bus 134. This provides a memory device with a low pin count. Similarly, read data signals are output from the flash memory device 100 through the I/O bus 134. The I/O bus 134 is connected to the I/O control unit 140 that routes the signals between the I/O bus 134 and an internal data bus 142, an internal address bus 144, and an internal command bus 146. The flash memory device 100 also includes a control logic unit 150 that receives a number of control signals either externally or through the command bus 146 to control the operation of the memory device 100. The commands received at the I/O control unit 140 are latched by a command register (not shown) and are transferred to the control logic unit 150 for generating internal signals to control device operations. The addresses are latched by an address register (not shown) and sent to a row decoder 160 or a column decoder 164 to select a row address or a column address, respectively.

Data are transferred to or from the memory array 130, byte by byte (eight digits), through the data register 180 and cache register 170. The cache register 170 is closest to the I/O control unit 140 and acts as a data buffer for the I/O data, whereas the data register 180 is closest to the memory array 130 and acts as a data buffer for the memory array operation. The memory array 130 is programmed and read in page-based operations and is erased in block-based operations. During normal page operations, the data register 180 and cache register 170 are tied together and act as a signal register. During cache operations, the data register 180 and cache register 170 operate independently, in a pipelined fashion, to increase data throughput.

In response to the memory commands decoded by the control logic unit 150, the flash memory cells in the array 130 are erased, programmed, or read. The memory array 130 is programmed on a row-by-row or page-by-page basis. After the row address signals have been applied to the address bus 144, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address coupled through the address bus 144. In a similar manner, during a read operation, data signals from a row or page of memory cells selected by the row address coupled through the address bus 144 are stored in a data register 180. Sets of data signals corresponding in size to the width of the I/O bus 134 are then sequentially transferred through the I/O control unit 140 from the data register 180 to the I/O bus 134.

In one embodiment of the invention, each digit of the cache register 170 is coupled to the column decoder 164 and I/O lines 312, 314 in accordance with the schematic diagram 300 of FIG. 3. The I/O lines 312, 314 may be part of the internal data bus 142 or additional components of the memory device not shown in FIG. 7. In another embodiment of the invention, the column decoder 164, cache register 170, data register 180, and memory array 130 are coupled in accordance with the schematic diagram 400 of FIG. 4. Furthermore, in an embodiment of the invention, the pattern generating algorithm may be implemented in the control logic unit 150. Alternatively, the pattern generating algorithm may be implemented in the column decoder 164 in another embodiment of the invention. Yet in another embodiment of the invention, the algorithm may be implemented elsewhere in the memory device or in various components of the memory device. For example, the pattern generating algorithm may be implemented partly in the control logic unit 130 and partly in the column decoder 164 according to still another embodiment of the invention.

Figure 8:
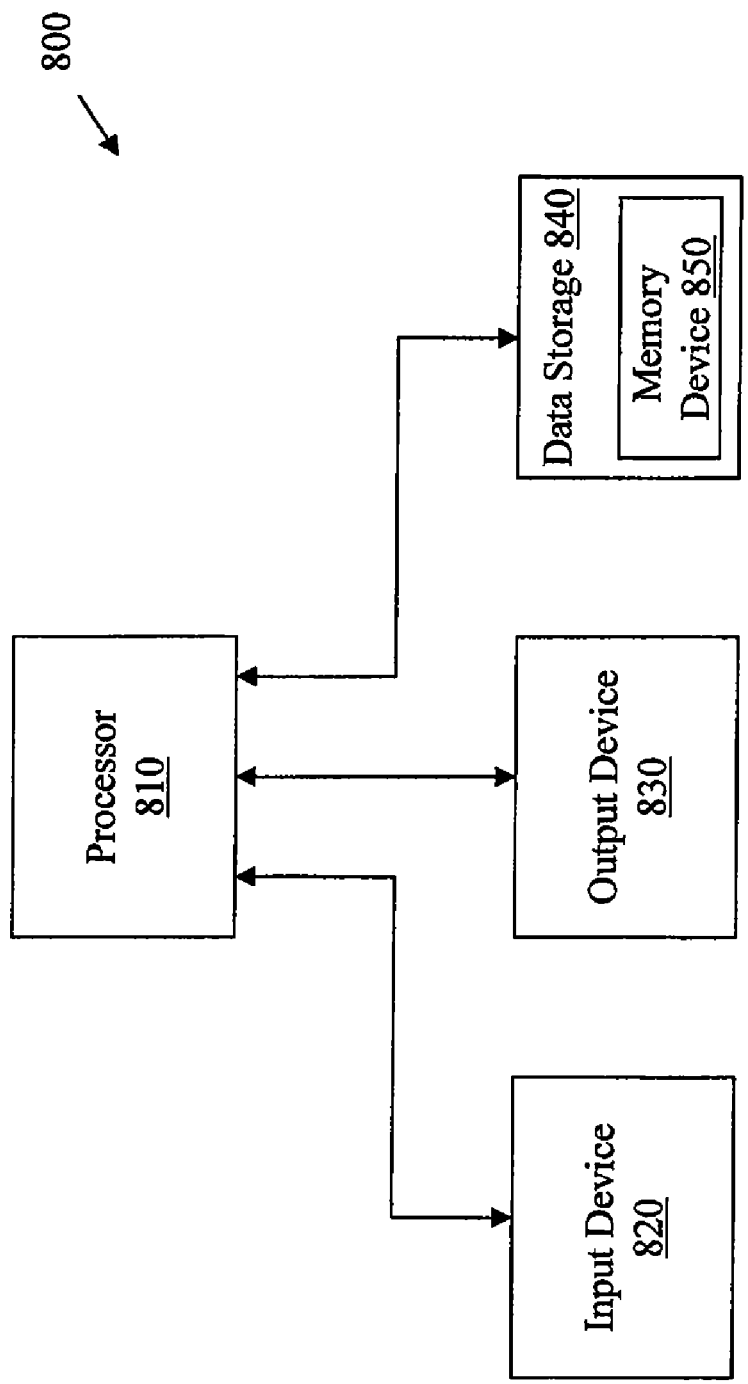
FIG. 8 is a simplified block diagram of a processor-based system including the flash memory device of FIG. 8.

FIG. 8 is a simplified block diagram of a processor-based system 800 including a flash memory device 850 in accordance with an embodiment of the invention. The processor-based system 800 may be, for example, a notebook computer, a PDA, a mobile phone, or a processor-based electronic device. The processor 810 is coupled through address, data, and control buses to the flash memory 850 to provide for writing data to and reading data from the flash memory 850. The processor 810 includes circuitry for performing various processing functions, such as executing specific software to perform specific calculations or tasks. The processor-based system 800 also includes one or more input devices 820 coupled to the processor circuitry 810 to allow an operator to interface with the processor-based system 800. Examples of input devices 820 include keypads, touch screens, and scroll wheels. The processor-based system 800 also includes one or more output devices 830 coupled to the processor circuitry 810 to provide output information to the operator. In one example, the output device 830 is a visual display providing visual information to the operator. Data storage 840 is also coupled to the processor 810 to store data that is to be retained even when power is not supplied to the processor-based system 800 or to the data storage 840. The data storage 840 may include a memory device 850, which may be the flash memory device 700 of FIG. 7 or anther memory device in accordance with an embodiment of the invention.

From the foregoing it will be appreciated that, although specific embodiments of the invention have been described herein for purposes of illustration, various modifications may be made without deviating from the spirit and scope of the invention. For example, although the above examples are related to memory devices having non-volatile memory, such as flash memory, embodiments of the invention are not limited to non-volatile memory applications. As will be appreciated by those ordinarily skilled in the art, embodiments of the invention may very well be implemented in applications using volatile memory, such as dynamic random access memory (DRAM), synchronous dynamic random access memory (SDRAM), or other types of volatile memory. Likewise, embodiments of the invention are not limited to flash memory but are also applicable to other types of non-volatile memory. Accordingly, the invention is not limited except as by the appended claims.

What is claimed is:

1. A data loading circuit in a memory device, the data loading circuit comprising:
   a plurality of switches configured to couple between a signal line and a buffer, the plurality of switches having respective control inputs and being configured to couple the signal line to the buffer in a manner that causes a pattern of data corresponding to a respective pattern of select signals applied to the respective control inputs of the switches to be stored in the buffer for each of a plurality of cells in the memory device; and pattern generating logic configured to generate patterns of the select signals for a plurality of cells of the memory device according to a pattern generating algorithm to cause the switches to load each of the patterns of data into the buffer for transferring to a respective plurality of the memory cells.

2. The data loading circuit of claim 1, wherein the pattern generating logic is operable to set the signal line to a first voltage value and cause the switches to couple a first plurality of digits of the buffer to the line, and further operable to set the signal line to a second voltage value and cause the switches to couple a second plurality of the digits of the buffer to the line so that each of the digits of the buffer is loaded with a respective data digit having either the first voltage value or the second voltage value in accordance with the respective patterns of the generated select signals according to the pattern generating algorithm.

3. The data loading circuit of claim 1, wherein the pattern generating logic is operable to cause a first set of digits of the buffer to be loaded simultaneously at a first pass, and further operable to cause a second set of digits of the buffer to be loaded simultaneously at a second pass such that all digits of the buffer are loaded at the completion of the second pass.

4. The data loading circuit of claim 1, wherein the pattern generating logic is further operable to cause the data loading circuit to load each of the generated patterns of data into the buffer for transferring to a respective row of the memory cell.

5. The data loading circuit of claim 1, wherein the pattern generating logic is operable to generate a signal indicative of whether or not the data digits of the data pattern loaded into the second buffer match the data digits in the first buffer.

6. The data loading circuit of claim 1, wherein the pattern generating logic is operable to generate a different set of data patterns each for a respective row of the memory cells when the memory device is in a different test mode.

7. The data loading circuit of claim 1, wherein the pattern generating algorithm comprises a plurality of pattern generating algorithms, and wherein the pattern generating logic is operable to generate patterns of data according to one of the plurality of pattern generating algorithms when the memory device is in one of a plurality of test modes.

8. The data loading circuit of claim 1, wherein the buffer is configured to receive write data to be stored in an array of memory cells and output read data from the array of memory cells a number of data digits at a time, the number of which is substantially less than the number of digits in the buffer.

9. The data loading circuit of claim 1, wherein the buffer comprises a first buffer coupled to an array of memory cells and a second buffer coupled to the first buffer and the pattern generating logic, wherein the pattern generating logic is operable to copy data digits of a loaded data pattern from a row of the array to the first buffer, and further operable to generate and load data digits of the loaded data pattern into the second buffer to compare with the data digits in the first buffer.

10. A memory device comprising:
a buffer coupled to an array of memory cells;
a plurality of switches configured to couple the buffer to a signal line, the plurality of switches configured to receive respective control inputs and couple the signal line to a respective digit of the buffer in response to respective select signals being applied to the control inputs of the switches; and
control logic coupled to the buffer and operable to enter a test mode in response to receiving a test mode command, the control logic further operable to generate patterns of select signals for a plurality of cells of the array according to a pattern generating algorithm and to cause the plurality of switches to load each of the patterns of data into the buffer for transferring to a respective plurality of the memory cells.

11. The memory device of claim 10, wherein the control logic is operable to set the signal line to a first voltage value and cause the switches to couple a first plurality of digits of the buffer to the line, and further operable to set the signal line to a second voltage value and cause the switches to couple a second plurality of the digits of the buffer to the line so that each of the digits of the buffer is loaded with a respective data digit having either the first voltage value or the second voltage value in accordance with the respective patterns of the generated select signals according to the pattern generating algorithm.

12. The memory device of claim 10, wherein the control logic is further configured to apply a first voltage to the signal line and to generate a first pattern of select signals, the control logic further configured to apply a second voltage to the signal line that is different from the first voltage and to generate a second pattern of the select signals that is different from the first pattern of the select signals to load a data pattern into the buffer for each of the rows of the memory cells in the array in response to entering the test mode, wherein the data pattern is loaded into the memory array one row of memory cells at a time in a way that for each row of the memory cells data digits having the first value are simultaneously loaded into the buffer and data digits having the second value are simultaneously loaded into the buffer.

13. The memory device of claim 12, wherein the data pattern includes a plurality of data digits some of which have a first value corresponding to the first voltage and the remaining of which have a second value corresponding to the second voltage.

14. The memory device of claim 10, wherein the control logic is operable to couple a select number of the plurality of switches simultaneously according to a data pattern generated by a pattern generating algorithm at a first instance, and wherein the control logic is further operable to couple a remaining number of the plurality of switches at a second instance.

15. The memory device of claim 10, wherein the control logic is configured to cause the buffer to receive write data and provide read data at a rate of a number of digits at a time, the number of the digits being substantially less than a number of the memory cells in each row of the memory array.

16. The memory device of claim 10, wherein the control logic is further operable to enter one of a plurality of test modes in response to receiving a respective one of a plurality of test mode commands, and wherein the control logic is further operable to generate and load a respective one of a plurality of data load patterns into the memory array through the buffer in response to entering the respective one of a plurality of test modes.

17. The memory device of claim 10, wherein the control logic is further operable to generate a signal indicative of whether or not the data digits of the portion of the data pattern loaded into the second buffer match the data digits in the first buffer.

18. The memory device of claim 10, wherein the buffer comprises a first buffer and a second buffer, wherein the control logic is operable to copy data digits of a portion of the loaded data pattern from a row in the memory array to the first buffer, and further operable to load the data digits of the portion of the data pattern into the second buffer for comparison with the data digits in the first buffer.

19. The memory device of claim 18, wherein each of the first and second buffers comprises: a respective plurality of digits the number of which equal to a number of the memory cells in each row of memory cells, and wherein the pattern generating logic is operable to set the signal line to a first voltage value and activate select ones of the switches to load a data digit having the first value into the corresponding digits of the buffer according to the data pattern for the respective row of memory cells, and further operable to set the signal line to a second voltage value and activate remaining ones of the switches to load a data digit having the second value into the corresponding digits of the buffer for the respective row of memory cells.

* * * * *